United States Patent
Son et al.

(10) Patent No.: US 12,414,252 B2
(45) Date of Patent: Sep. 9, 2025

(54) DISPLAY PANEL AND A MANUFACTURING METHOD THEREOF

(71) Applicant: LG Display Co., Ltd., Seoul (KR)

(72) Inventors: Jiho Son, Paju-si (KR); Geonhyeong Kim, Paju-si (KR); Hoyoon Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 245 days.

(21) Appl. No.: 17/976,299

(22) Filed: Oct. 28, 2022

(65) Prior Publication Data

US 2023/0217619 A1 Jul. 6, 2023

(30) Foreign Application Priority Data

Dec. 30, 2021 (KR) .................. 10-2021-0192360

(51) Int. Cl.
*H05K 5/03* (2006.01)
*B32B 7/12* (2006.01)
*C09D 11/037* (2014.01)
*B32B 17/06* (2006.01)
*B32B 27/28* (2006.01)
*H10K 59/12* (2023.01)

(52) U.S. Cl.
CPC ................. *H05K 5/03* (2013.01); *B32B 7/12* (2013.01); *C09D 11/037* (2013.01); *B32B 17/06* (2013.01); *B32B 27/281* (2013.01); *B32B 2255/10* (2013.01); *B32B 2255/28* (2013.01); *B32B 2307/412* (2013.01); *B32B 2307/42* (2013.01); *B32B 2457/20* (2013.01); *H10K 59/12* (2023.02)

(58) Field of Classification Search
CPC . B32B 3/30; G02F 1/133331; H10K 50/8426; H10K 50/865; H10K 59/10; H10K 59/12; H10K 59/40; H10K 59/873; H10K 59/8792
See application file for complete search history.

(56) References Cited

U.S. PATENT DOCUMENTS

| 10,804,486 B2 | 10/2020 | Kim et al. |
| 2018/0184529 A1 | 6/2018 | Kim et al. |

FOREIGN PATENT DOCUMENTS

| CN | 110865741 A | * | 3/2020 | ......... G02F 1/13338 |
| KR | 10-2018-0074270 A | | 7/2018 | |
| KR | 10-2019-0031398 A | | 3/2019 | |
| KR | 10-2019-0072134 A | | 6/2019 | |

OTHER PUBLICATIONS

CN 110865741 Machine Translation (Year: 2020).*
KR 2019-0031398 Machine Translation (Year: 2019).*
Korean Intellectual Property Office, Office Action, Korean Patent Application No. 10-2021-0192360, Nov. 13, 2024, 18 pages.

* cited by examiner

*Primary Examiner* — Zachary M Davis
(74) *Attorney, Agent, or Firm* — Fenwick & West LLP

(57) ABSTRACT

Disclosed is a display panel and a manufacturing method thereof. The display panel includes a plurality of ink layers applied in a cover window and a manufacturing method thereof.

16 Claims, 16 Drawing Sheets

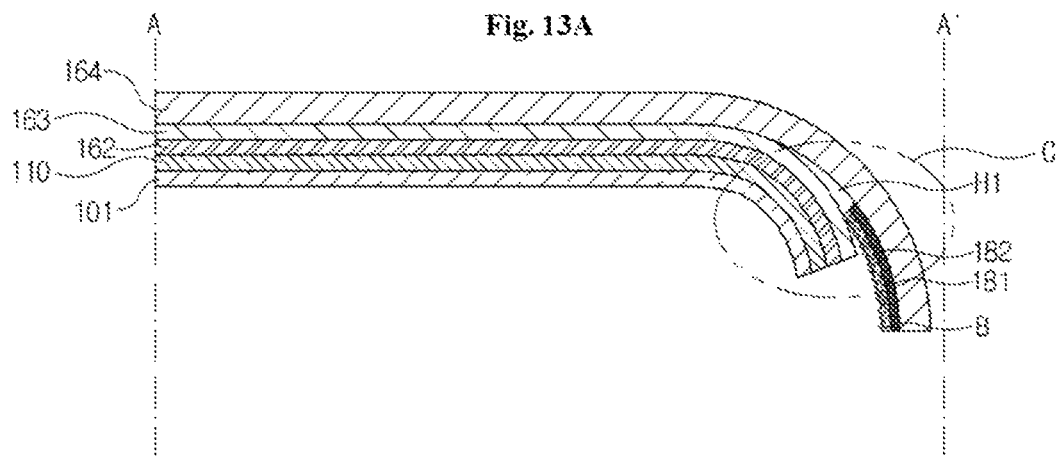
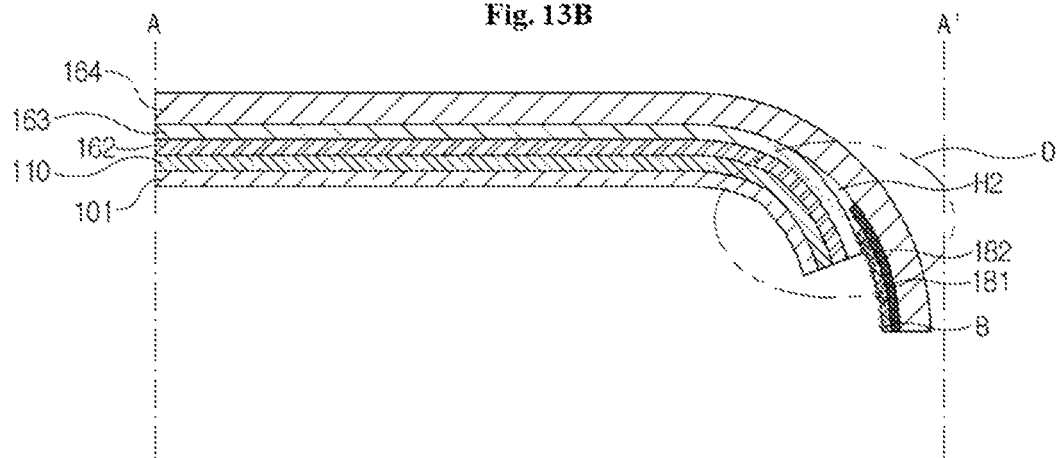

DISPLAY PANEL AND A MANUFACTURING METHOD THEREOF

CROSS REFERENCE TO RELATED APPLICATION

The present application claims priority to Republic of Korea Patent Application No. 10-2021-0192360, filed on Dec. 30, 2021, which is hereby incorporated by reference in its entirety.

BACKGROUND

Field of Technology

The present disclosure relates to a display panel and a manufacturing method thereof and particularly to a display panel having a plurality of ink layers applied in a cover window and a manufacturing method thereof.

Description of the Related Art

As examples of a display device, a liquid crystal display (LCD), a field emission display device (FED), an electrowetting display device (EWD) and an organic light emitting display device (OLED) are used.

Such a display device may include a cover window made of a glass or plastic material so as to protect a display panel from external shocks. An adhesive layer is applied to the cover window in order to laminate a polarizer or a panel layer below the cover window. The adhesive layer is swept in a side of the cover window while laminating the polarizer or the panel layer and the adhesive layer remains on a side of the cover window.

The leftover of the adhesive layer remaining on a side of the cover window may cause a problem such as an adhesion defect and the like if adhering a set frame such as a middle frame thereto.

SUMMARY

The present disclosure aims to solve such a problem, specifically, to improve a problem of leftover on a side of the cover window occurring when laminating the cover window and a panel layer.

One embodiment is a display panel including: a cover window; an adhesive layer configured to be disposed below the cover window; a first ink layer configured to be disposed below the cover window; a second ink layer configured to be disposed below the first ink layer and include a coarse pattern; and a panel layer configured to be disposed below the adhesive layer.

The coarse pattern may include an embossed pattern.

The embossed pattern includes a plurality of beads.

The second ink layer may be formed in a pad printing method, and a second ink material being applied to a printing pad may include the plurality of beads.

The coarse pattern may include an engraving pattern.

The second ink layer may be formed in a pad printing method, and the printing pad may have an embossed pattern in an application area of a second ink material.

An end of the first ink layer protrudes further inwards than an end of the second ink layer.

A display panel may further comprise a third ink layer configured to be disposed below the first ink layer.

The third ink layer may be disposed more inwards than the second ink layer and the third ink layer may be attached to a middle frame.

The present disclosure provides a method of manufacturing a display panel comprising: transferring a first ink material onto a printing pad; forming a first ink layer by compressing the printing pad on a cover window; transferring a second ink material onto the printing pad; forming a second ink layer on which an embossed pattern is formed by compressing the printing pad on the cover window; and laminating a panel layer by applying an adhesive layer in the cover window.

The second ink material includes a plurality of beads.

A method of manufacturing a display panel may further comprise: before laminating the panel layer, transferring a third ink material onto the printing pad; and forming a third ink layer by compressing the printing pad on the cover window.

A method of manufacturing a display panel may further comprise attaching a middle frame to the third ink layer.

The present disclosure provides a method of manufacturing a display panel comprising: transferring a first ink material onto a printing pad; forming a first ink layer by compressing the printing pad on a cover window; transferring a second ink material onto the printing pad; forming a second ink layer on which an engraving pattern is formed by compressing the printing pad on the cover window; and laminating a panel layer by applying an adhesive layer in the cover window.

Transferring the second ink material may comprise compressing the printing pad on which an embossed pattern is formed on the second ink material.

A method of manufacturing a display panel may further comprise: before laminating the panel layer, transferring a third ink material onto the printing pad; and forming a third ink layer by compressing the printing pad on the cover window.

A method of manufacturing a display panel may further comprise attaching a middle frame to the third ink layer.

According to the present disclosure, by forming the second ink layer that includes an embossed coarse pattern below the cover window, a problem of leftover may improve, which occurs on a side of the cover window when the adhesive layer is swept.

According to the present disclosure, by forming the second ink layer that includes an engraving coarse pattern below the cover window, a problem of leftover may improve, which occurs on a side of the cover window when the adhesive layer is swept.

According to the present disclosure, by forming the third ink layer below the cover window, adhesion with the middle frame may improve.

According to the present disclosure, by forming the first ink layer to protrude more than the second ink layer, a problem of the adhesive layer being detached from the cover window my improve.

The present disclosure may provide a method of manufacturing the display panel in which the second ink layer including an embossed coarse pattern is formed below the cover window.

The present disclosure may provide a method of manufacturing the display panel in which the second ink layer including the coarse engraving pattern is formed below the cover window.

BRIEF DESCRIPTION OF THE DRAWINGS

FIGS. 13A and 13B show cross sections taken along A-A' of FIG. 8 according to an embodiment of the present disclosure.

DETAILED DESCRIPTION

Figure 1:
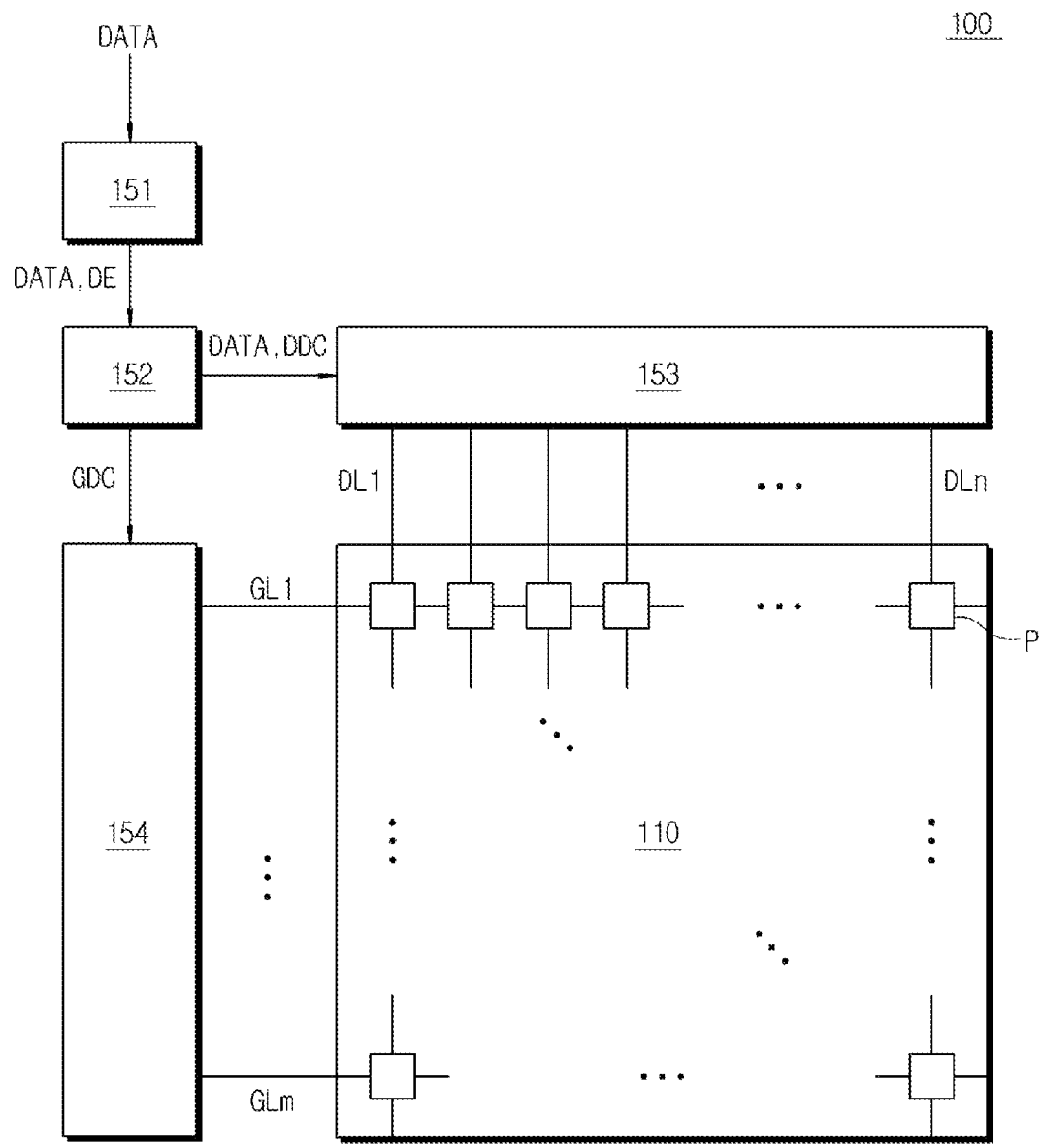
FIG. 1 is a block diagram of a display panel according to an embodiment of the present disclosure.

Hereinafter, the embodiments will be described with reference to the accompanying drawings. When an element (or an area, a layer, a part and the like) is 'on' another element, is 'connected' with, or is 'coupled' with another element, the element may be directly connected with or coupled to another element or a third intervening element may be disposed therebetween.

Like reference numerals of the accompanying drawings denote like elements. In addition, thicknesses, ratio and dimensions of the elements in the accompanying drawings are exaggerated for convenience of describing the specification. The term "and/or" includes any and all combinations of one or more of the associated listed items.

Though terms such as 'a first', or 'a second' are used to describe various components, these components are not confined by these terms. These terms are merely used to distinguish one component from the other component. For example, without departing from the scope of the rights of various embodiments of the present invention, a first component may be referred to as a second component, and similarly, a second component may be referred to as a first component. The singular forms expressed herein are intended to include the plural forms as well, unless the context expressly indicates otherwise.

Terms such as 'below', 'at a lower portion', 'on', 'at an upper portion' and the like are used to describe position relation of parts illustrated in the accompanying drawings. Such terms are of relative concept, and are explained based on the directions marked in the drawings.

It should be understood that terms such as 'comprise', or 'have' and the like are used only to designate that there are features, numbers, steps, operations, components, parts or combination thereof, however such terms do not preclude existence or addition of one or more another features, numbers, steps, operations, components, parts or combination thereof.

Also, the present disclosure decided to explain an organic light emitting display device as an example for convenience of description. However, the concept of the present disclosure is not confined by the organic light emitting display device, and may be applied in the same way to other types of display panels such as a liquid crystal display panel, a mini-LED display panel and the like.

FIG. 1 is a block diagram of a display panel according to an embodiment of the present disclosure.

Referring to FIG. 1, a display panel 100 may include an image processor 151, a timing controller 152, a data driver 153, a gate driver 154, and a panel layer 110.

The image processor 151 may output a data enable signal (DE) and a data signal (DATA) being supplied from the outside. Apart from the data enable signal (DE), the image processor 151 may output one or more signals among a vertical synchronizing signal, a horizontal synchronization signal and a clock signal.

The timing controller 152 is supplied with the data signal (DATA), and a driving signal that includes the data enable signal (DE), a vertical synchronizing signal, a horizontal synchronizing signal and a clock signal from the image processor 151. The timing controller 152 may output a gate timing control signal (GDC) for controlling an operation timing of a gate driver 154, and a data timing control signal (DDC) for controlling an operation timing of a data driver 153.

In response to the data timing control signal (DDC) supplied from the timing controller 152, the data driver 153 may convert the data signal (DATA) into gamma reference voltages through sampling and latching and output it thereafter. The data driver 153 may output the data signal (DATA) through data lines (DL1~DLn).

The gate driver 154 may output a gate signal while shifting a level of a gate voltage in response to the gate timing control signal (GDC) supplied by the timing controller 152. The gate driver 154 may output the gate signal through gate lines (GL1~GLm).

The panel layer 110 may display images as sub-pixels (P) emit light by responding to the data signal (DATA) and the gate signal supplied by the data driver 153 and the gate driver 154. Detailed structure of a sub-pixel (P) will be described with reference to FIG. 2 to FIG. 5.

Figure 2:
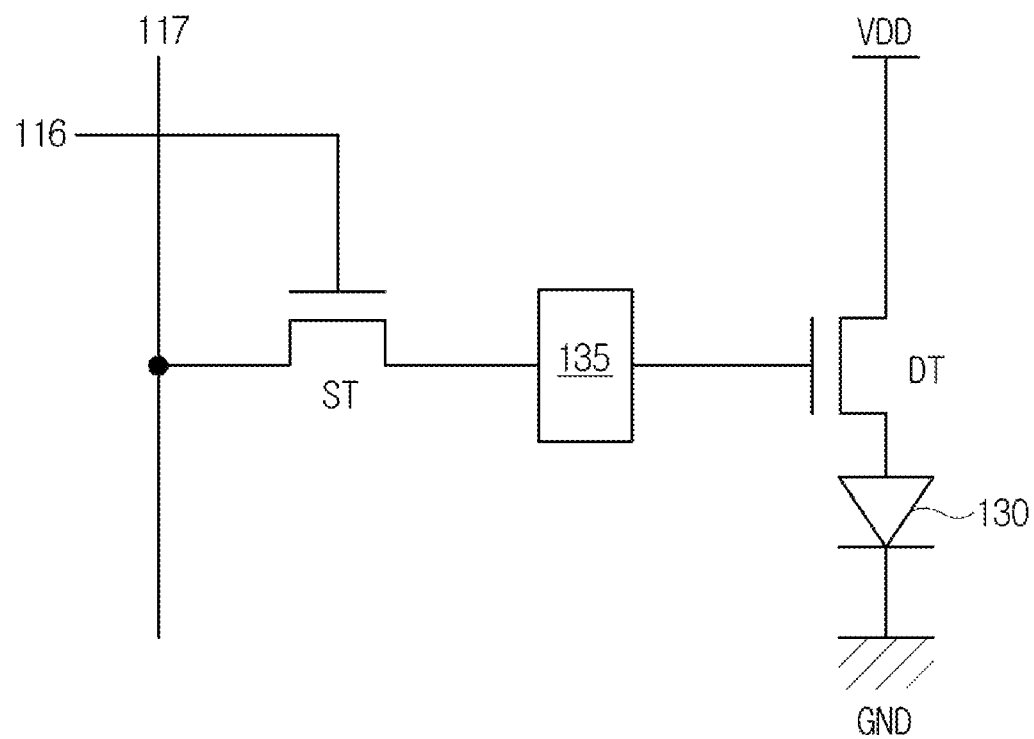
FIG. 2 is a circuit diagram of a sub-pixel included in a display panel according to an embodiment of the present disclosure.

FIG. 2 is a circuit diagram of a sub-pixel included in a display panel 100 according to an embodiment of the present disclosure.

Referring to FIG. 2, a sub-pixel of a display panel 100 may include a switching transistor (ST), a driving transistor (DT), a compensation circuit 135, and a light emitting element 130.

The light emitting element 130 may operate to emit light responsive to a driving current formed by a driving transistor (DT).

The switching transistor (ST) may operate switching so that the data signal supplied through a data line 117 responding to the gate signal provided through a gate line 116 can be saved as a data voltage in a capacitor.

The driving transistor (DT) may operate to flow a regular driving current between a high potential power line (VDD) and a low potential power line (GND), by corresponding to a data voltage stored in a capacitor.

The compensation circuit 135 compensates a threshold voltage of the driving transistor (DT) and the like, and the compensation circuit 135 may include one or more thin film transistors and capacitors. Configuration of the compensation circuit 135 may vary greatly depending on manners of compensation. For example, a sub-pixel in FIG. 2 is configured as 2T1C (two Transistors and one Capacitor) structure which includes a switching transistor (ST), a driving transistor (DT), a capacitor, and a light emitting element 130. However, if a compensation circuit 135 is added thereto, the sub-pixel may be configured variously such as 3T1C, 4T2C, 5T2C, 6T1C, 6T2C, 7T1C, 7T2C and the like.

Figure 3:
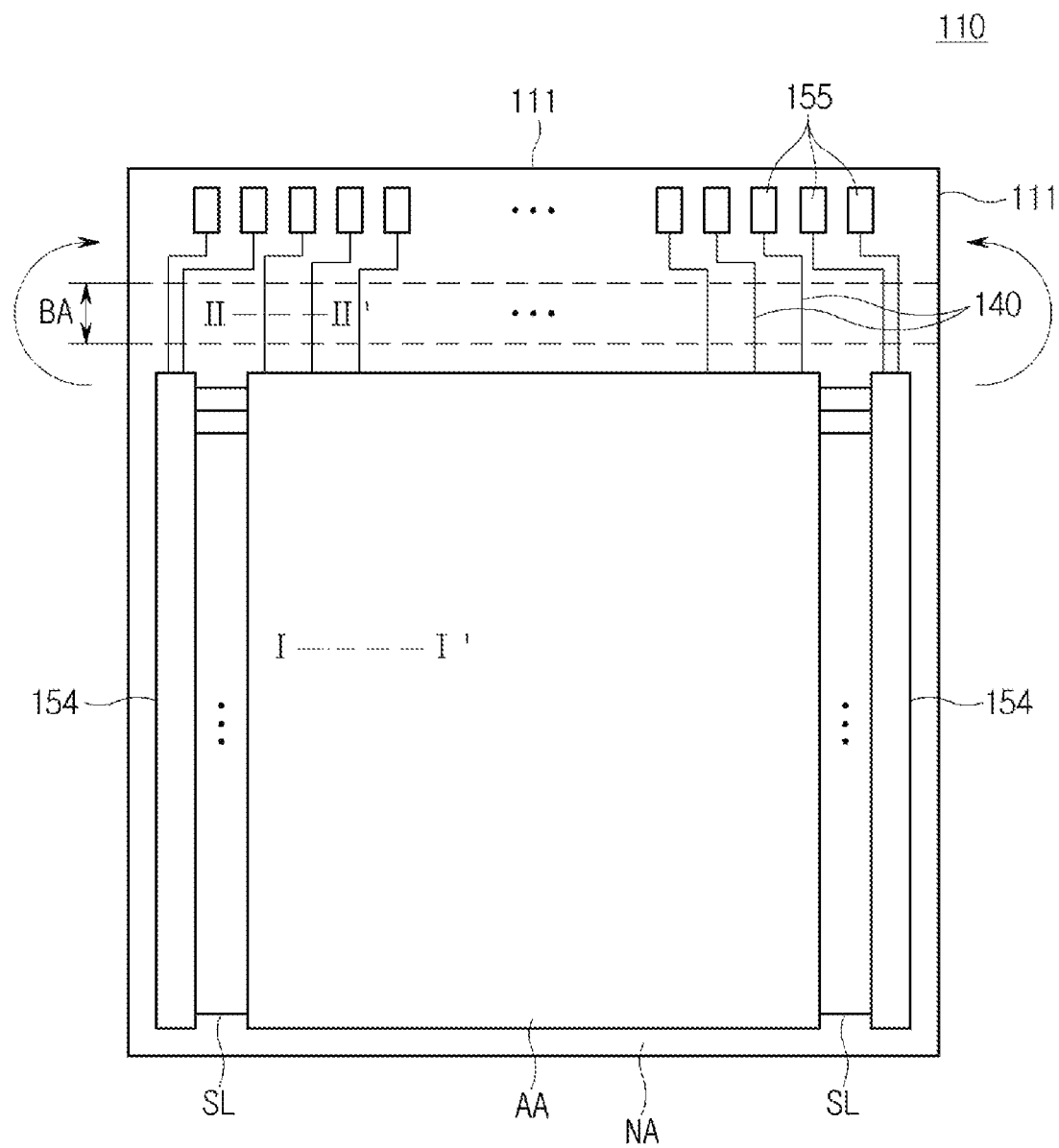
FIG. 3 is a plan view of a display panel according to an embodiment of the present disclosure.

FIG. 3 is a plan view of a display panel according to an embodiment of the present disclosure.

FIG. 3 shows an example of a state where a panel layer of the display panel 100 is not bent.

Referring to FIG. 3, the panel layer 110 may include an active area (AA) where pixels emitting light through a thin film transistor and a light emitting element are disposed upon a flexible substrate 111, and a non-active area (NA) that is the bezel area surrounding edges of the active area (AA).

In the non-active area (NA) of the flexible substrate 111, a circuit such as a gate driver 154 to drive the panel layer 110 and the like and wirings of various signals such as a scan line (SL) and the like may be disposed.

A circuit to drive the panel layer 110 may be disposed upon the flexible substrate 111 in gate in panel (GIP) manner, or be connected to the flexible substrate 111 in tape carrier package (TCP) or chip on film (COF) manner.

A bending area (BA) may be formed at a side of the non-active area (NA). The bending area (BA) may refer to an area of the flexible substrate 111 that is configured to be bent in an arrow direction.

In the non-active area (NA) of the flexible substrate 111, wirings and a driving circuit in order to drive a screen are disposed. Since an image is not displayed in the non-active area (NA), the non-active area (NA) does not need to be acknowledged from a front surface of the flexible substrate 111. Therefore, an area to position the wirings and the driving circuit can be secured while at the same time reducing the bezel, by bending some area of the non-active area (NA) of the flexible substrate 111.

Various wirings may be formed upon the flexible substrate 111. The wiring may be formed in the active area (AA) of the substrate 111. The wiring may be formed in the active area (AA) or in the non-active area (NA) of the flexible substrate 111. The wiring of circuits 140 is formed of a conductive material, and may be formed of a conductive material with excellent flexibility in order to reduce a crack caused when the flexible substrate 111 is bent. The wiring of circuits 140 may be formed of a conductive material with excellent flexibility. The wiring of circuits 140 may be formed of conductive materials having excellent flexibility such as gold (Au), silver (Ag), aluminum (Al) and the like. Alternatively, the wiring of circuits 140 may be formed of alloys of magnesium (Mg) and silver (Ag), molybdenum (Mo), chrome (Cr), titanium (Ti), nickel (Ni), neodymium (Nd) and copper (Cu). The wiring of circuits 140 may be formed in a multi-layer structure that includes various conductive materials, and for example, may be formed in a three-layer structure of titanium (Ti), aluminum (Al) and titanium (Ti).

The wiring of circuits 140 formed in the bending area (BA) receives tensile force when being bent. The wiring of circuits 140 that extends in the same direction as a bending direction in the flexible substrate 111 gets the largest tensile force. Therefore, some of the wiring of circuits 140 disposed in the bending area (BA) may be formed to extend in a diagonal direction which differs from the bending direction.

Figure 4:
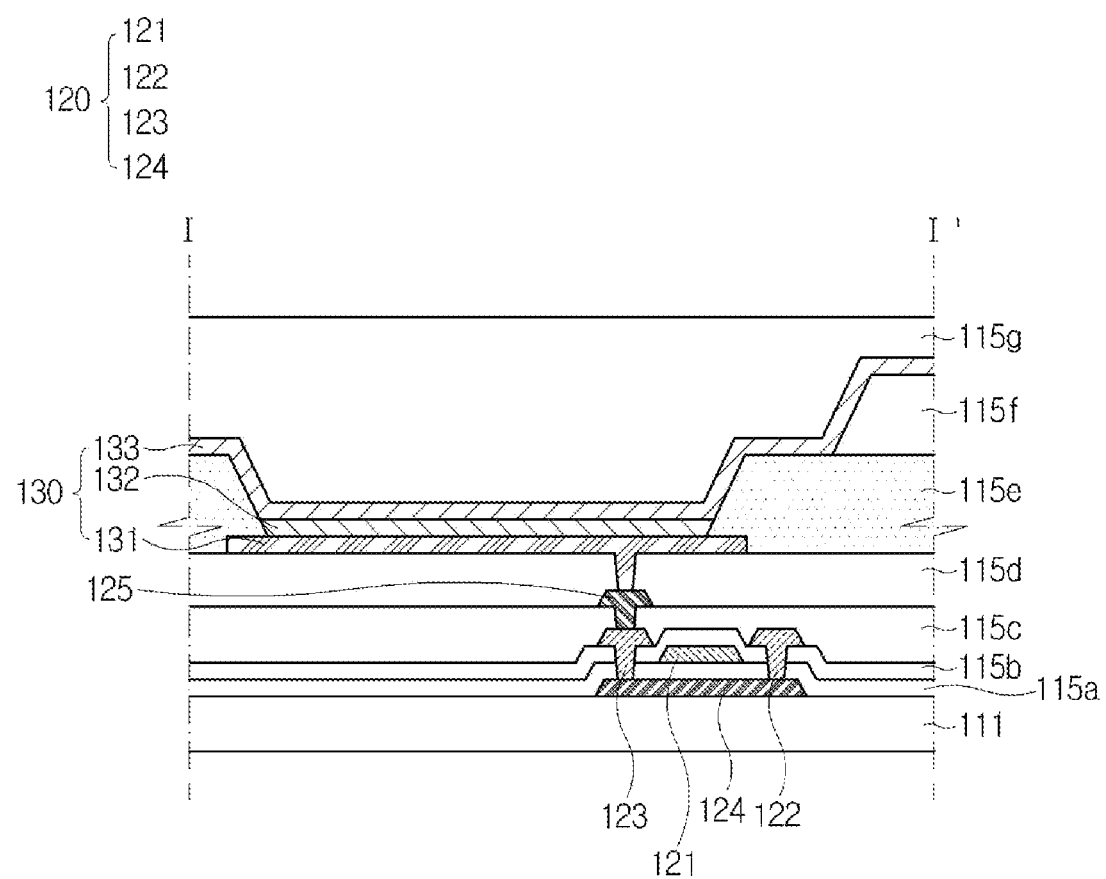
FIG. 4 is a sectional view of a panel layer taken along I-I' of FIG. 3 according to an embodiment of the present disclosure.

FIG. 4 is a sectional view of a panel layer taken along I-I' of FIG. 3 according to one embodiment.

Figure 5:
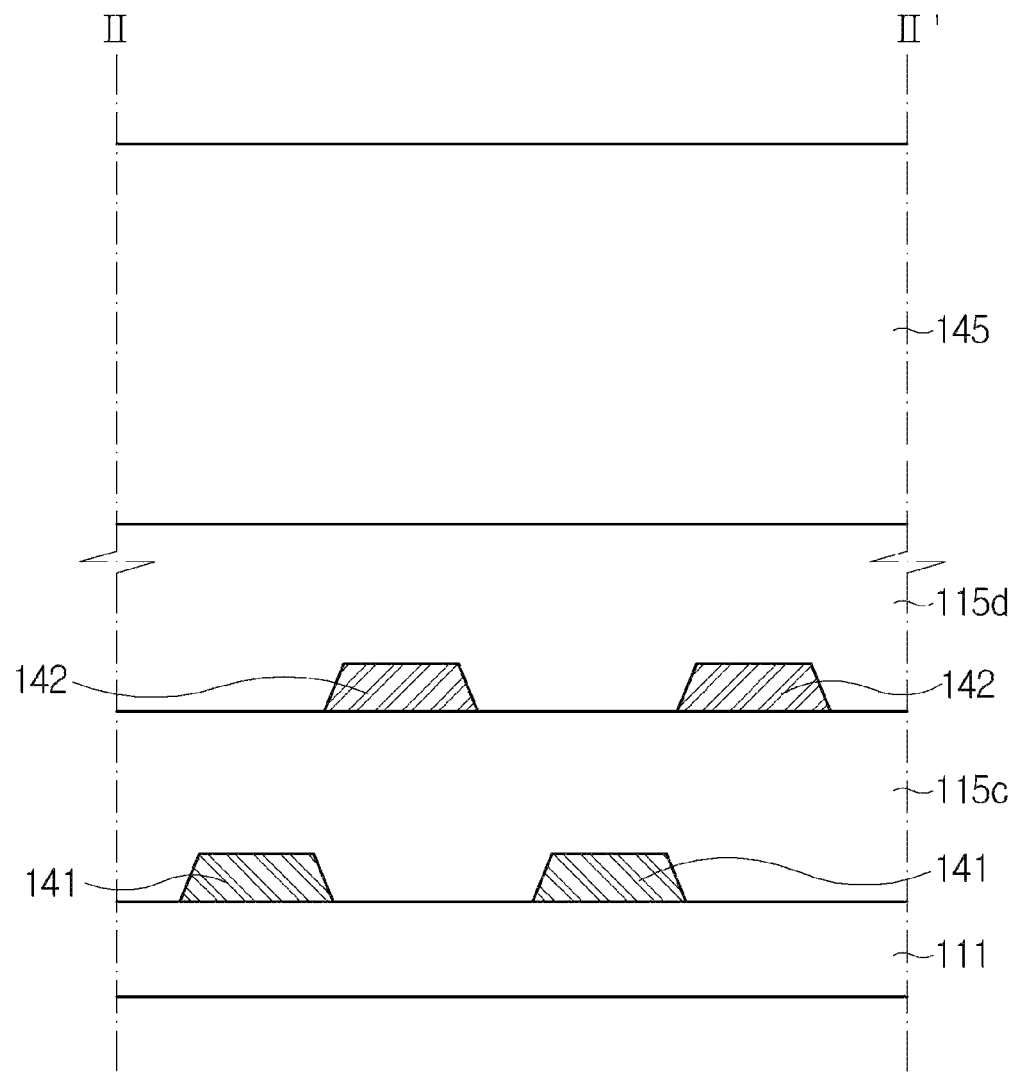
FIG. 5 is a sectional view of a panel layer taken along II-II' of FIG. 3 according to an embodiment of the present disclosure.

FIG. 5 is a sectional view of a panel layer taken along II-II' of FIG. 3 according to one embodiment.

The panel layer 110 according to the present disclosure will be described by referring to FIG. 4 and FIG. 5.

Referring to FIG. 4, the flexible substrate 111 is a plate-shaped configuration disposed at the bottom, and serves to support and protect other components disposed upon the flexible substrate 111. The flexible substrate 111 may be formed of glass or plastic. For example, the flexible substrate 111 may be formed of a film including one of the groups consisting of a polyester polymer, a silicone polymer, an acrylic polymer, a polyolefin polymer, and a copolymer thereof.

A buffer layer (not illustrated) may be further disposed in the flexible substrate 111. The buffer layer prevents or at least reduces penetration of moisture or foreign substance from the outside into the flexible substrate 111, and may flatten a surface of the flexible substrate 111. The buffer layer is not a necessary configuration, and may be omitted depending on a kind of thin film transistor 120 disposed in the flexible substrate 111.

The thin film transistor 120 is disposed in the flexible substrate 111 and may include a gate electrode 121, a source electrode 122, a drain electrode 123, and a semiconductor layer 124. The semiconductor layer 124 may be formed of amorphous silicon or polycrystalline silicon. The semiconductor layer 124 may be formed of an oxide semiconductor. The semiconductor layer 124 may include a drain region, a source region including p-type or n-type impurities and a channel region existing between the source region and the drain region. In addition, the semiconductor layer 124 may further include a lightly-doped region in the source region or the drain region located adjacent to the channel region.

The source region or the drain region are heavily doped with impurities and the source electrode 122 and the drain electrode 123 of the thin film transistor 120 may be connected thereto respectively.

Depending on a structure of the thin film transistor of NMOS or PMOS, the channel region of the semiconductor layer 124 may be doped with n-type or p-type impurities.

A first insulation layer 115a may be formed of a single layer or multi-layer structure of silicon oxide (SiOx) or silicon nitride (SiNx). The first insulation layer 115a may be disposed so that a current flowing through the semiconductor layer 124 does not flow to the gate electrode 121.

The gate electrode 121 may serve as a switch for turning on or off the thin film transistor 120 based on an electric signal transmitted from the outside through the gate line. The source electrode 122 and the drain electrode 123 are connected to the data line, and may allow an electric signal transmitted from the outside to be transmitted from the thin film transistor 120 to the light emitting element 130.

A second insulation layer 115b may be formed on the first insulation layer 115a and the gate electrode 121. The second insulation layer 115b may be formed of a single layer or multiple layers of silicon oxide or silicon nitride to insulate the gate electrode 121, the source electrode 122 and the drain electrode 123 with each other.

A first planarization layer 115c and a second planarization layer 115d may be disposed on the second insulation layer 115b. The first planarization layer 115c and the second planarization layer 115d may be configurations to protect the thin film transistor 120 and flatten out steps formed by the thin film transistor 120. The first planarization layer 115c and the second planarization layer 115d may be formed of one or more materials among acrylic resin, epoxy resin, phenol resin, polyamide resin, unsaturated polyester resin, poly-phenylene resin, poly-phenylene sulfide resin, and benzocyclobutene.

An intermediate electrode 125 may be connected to the thin film transistor 120 through a contact hole formed in the first planarization layer 115c. The intermediate electrode 125 may electrically connect an anode electrode 131 (to be described later) and the drain electrode 123 of the thin film transistor 120.

The light emitting element 130 may be disposed on the second planarization layer 115d. The light emitting element 130 may include the anode electrode 131, a light-emitting portion 132, and a cathode electrode 133.

The anode electrode 131 is disposed on the second planarization layer 115d, and may serves to supply a hole to a light-emitting portion 132. The anode electrode 131 may be in contact with the intermediate electrode 125 through a contact hole formed to penetrate the second planarization layer 115d. The anode electrode 131 may be formed of indium zinc oxide, indium tin oxide and the like which are transparent conductive materials.

A bank 115e may be disposed on the anode electrode 131 and the second planarization layer 115d. The bank 115e may define sub-pixels by dividing areas that actually emit light. A spacer 115f may be disposed on the bank 115e so as to prevent damage arising upon contacting with a deposition mask.

The light-emitting portion 132 may be disposed on the anode electrode 131. The light-emitting portion 132 may serve to emit light. The light-emitting portion 132 may include organic light emitting materials that emit light by themselves by an electric signal. The light-emitting portion 132 may include organic light emitting materials that emit colors, for example, red, green, blue, white and the like.

The cathode electrode 133 may be disposed on the light-emitting portion 132. The cathode electrode 133 may serve to supply an electron to the light-emitting portion 132. The cathode electrode 133 may be formed of metal such as magnesium (Mg), an alloy of silver and magnesium and the like. In addition, the cathode electrode 133 may be formed of transparent conductive oxides such as series of tin oxide, indium zinc oxide, indium tin oxide, indium zinc tin oxide, zinc oxide and the like.

An encapsulation layer 115g may be disposed on the cathode electrode 133. The encapsulation layer 115g may serve to prevent or at least reduce damage arising out of oxidization of components disposed below after moisture, oxygen, or foreign material introduced from the outside penetrate into the components. The encapsulation layer 115g may be formed by laminating a plurality of barrier films. The encapsulation layer 115g may be formed of aluminum oxide or silicon nitride which are inorganic substances.

In describing FIG. 5, matters that are redundant with what are mentioned above will be omitted.

Referring to FIG. 5, the display panel 100 according to the present disclosure may include a first wiring 141 and a second wiring 142 configured in a double-layer in the non-active area (NA) including the bending area (BA).

Specifically, in the flexible substrate 111, the first wiring 141 may be formed. On the first wiring 141, the first planarization layer 115c may be formed. On the first planarization layer 115c, the second wiring 142 may be formed. On the second wiring 142, the second planarization layer 115d may be formed. On the second planarization layer 115d, a micro-coating layer 145 may be formed.

The first wiring 141 and the second wiring 142 are aimed at connecting the panel layer 110 and the pad area (PA). The first wiring 141 and the second wiring 142 may be formed of conductive materials having excellent flexibility such as silver, gold, aluminum and the like. Alternatively, the first wiring 141 and the second wiring 142 may be formed of alloys of molybdenum, chrome, titanium, nickel, neodymium, copper, silver and the like.

While the flexible substrate 111 is bent, a huge stress is given to the bending area (BA). A crack may occur in layers that surround wirings due to such stress. Also, a large space to arrange the wirings is required when forming wirings in a single layer. As in the present disclosure, by configuring wirings passing the bending area (BA) to be formed in a multiple-layer structure, it is possible to reduce stress occurring in layers wrapping the wirings and decrease a space to arrange the wirings.

Figure 6:
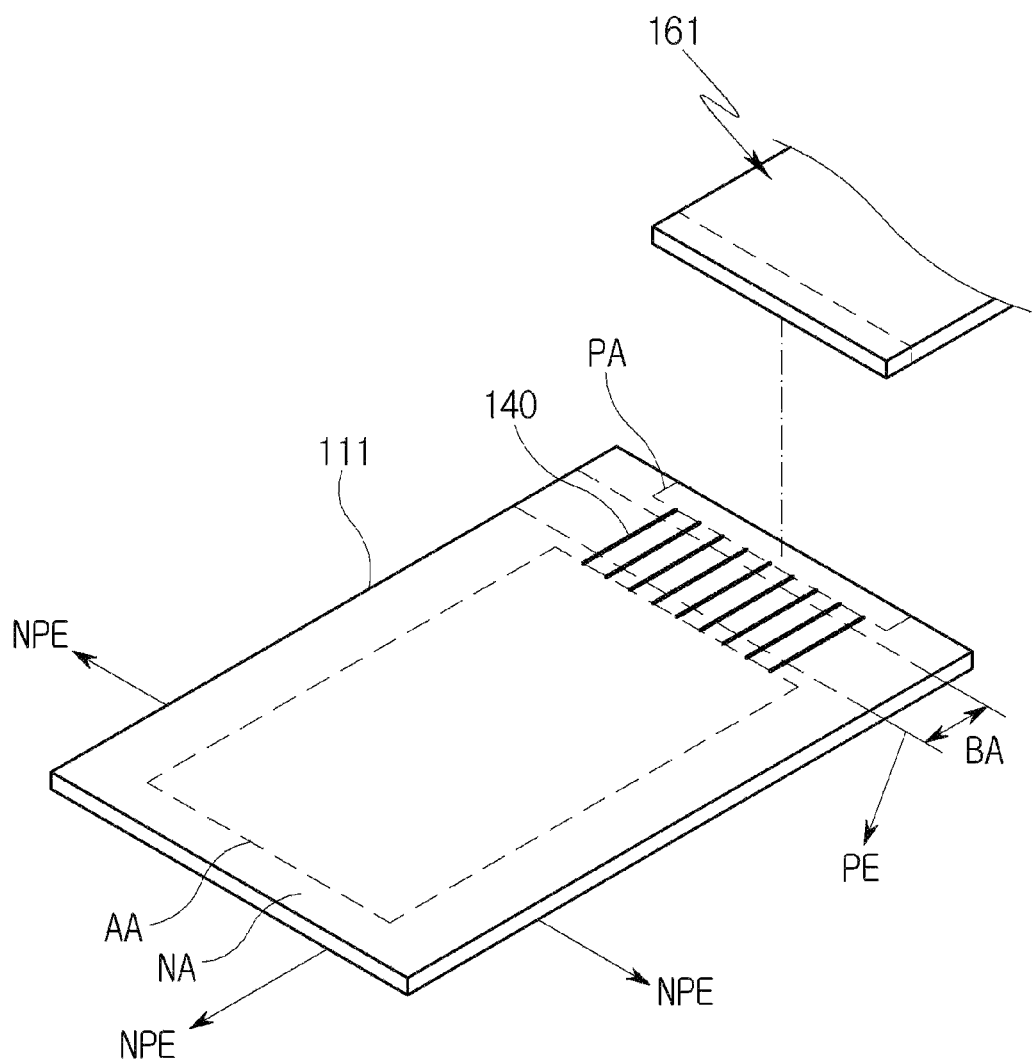
FIG. 6 is a perspective view of a flexible panel according to an embodiment of the present disclosure.

FIG. 6 is a perspective view of a flexible panel according to an embodiment of the present disclosure.

Figure 7:
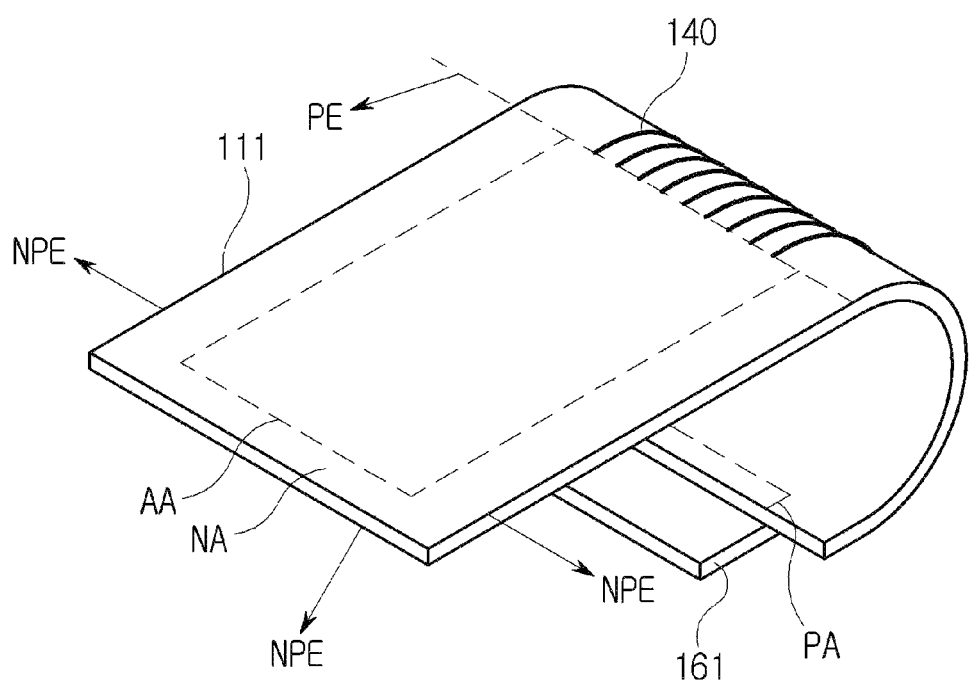
FIG. 7 is a perspective view that shows a bending status of a flexible substrate according to an embodiment of the present disclosure.

FIG. 7 is a perspective view that shows a bending status of a flexible substrate according to an embodiment of the present disclosure.

Figure 8:
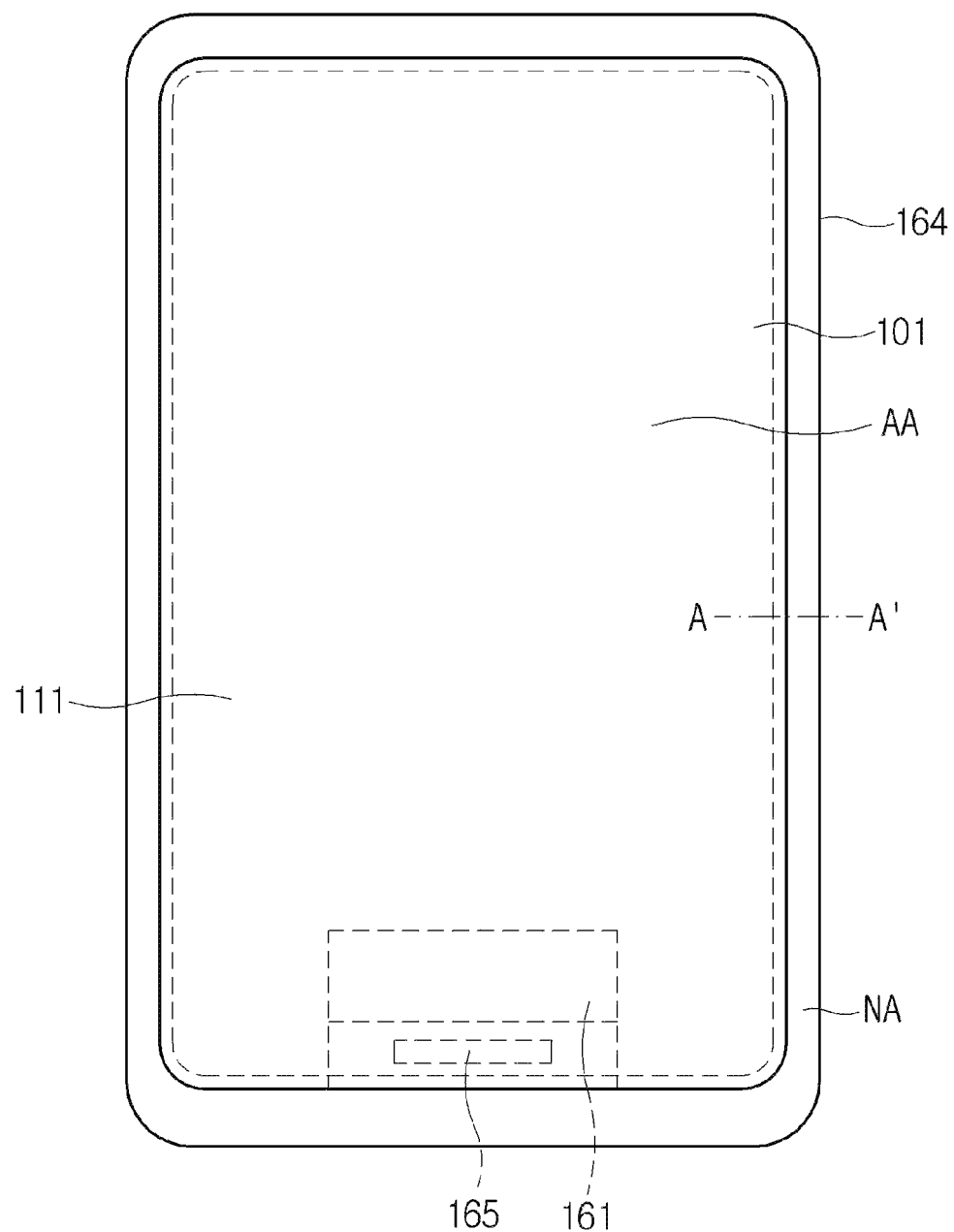
FIG. 8 is a plan view that shows a bent flexible panel according to an embodiment of the present disclosure.

FIG. 8 is a plan view that shows a bent flexible panel according to an embodiment of the present disclosure.

Referring to FIG. 6 to FIG. 8, the flexible substrate according to the present disclosure will be explained.

Referring to FIG. 6, the flexible substrate 111 may be divided into the active area (AA) and the non-active area (NA) surrounding edges of the active area (AA). In the non-active area (NA), the pad area (PA) in which the pads are disposed may be divided. In the active area (AA), a plurality of sub-pixels are disposed. The sub-pixels may be divided by gate lines and data lines that cross each other.

A circuit element 161 may be a configuration that is connected with the pads in the pad area (PA) of the flexible substrate 111. The circuit element 161 may include bumps or steps. The bumps of the circuit element 161 may be connected with the pads of the pad area (PA) through an anisotropic conductive film. The circuit element 161 may be a chip on film (COF) in which a driver IC is mounted in a flexible film. In addition, the circuit element 161 may be bonded to the pads directly through chip on glass (COG) process. Also, the circuit element 161 may be a flexible circuit such as a Flexible Printed Circuit (FPC). The present disclosure will be described based on COF taken as an example of the circuit element 161.

Referring to FIG. 7, the flexible substrate 111 may be bent in a rear direction so that a side contacting with the pad area (PA) can have a predefined curvature. As the flexible substrate 111 gets bent, the pad area (PA) may overlap with the active area (AA) in a rear direction of the active area (AA). From the front of the display panel 100, the circuit element 161 or the driver IC 165 (as shown in FIG. 8 to be described later) may not be made visible. For bending, the flexible substrate 111 may be formed of a flexible material. For example, the flexible substrate 111 may be formed of a plastic material such as polyimide.

Referring to FIG. 8, on a surface of the bent flexible substrate 111, the cover window 164 may be coupled. The cover window 164 is formed to be larger than the bent flexible substrate 111 so that the cover window 164 can accommodate the flexible substrate 111 in its inside.

Also, on another surface of the bent flexible substrate 111, a backplate 101 may be coupled. The backplate 101 may serve to maintain rigidity of the display panel 100, prevent or at least reduce foreign substances from attaching to the bottom portion of the display panel 100 and absorb external shocks. The backplate 101 may be implemented as a plastic thin film made of polyimide. Forming the backplate 101 not in the bending area (BA) may be appropriate.

Figure 9A:
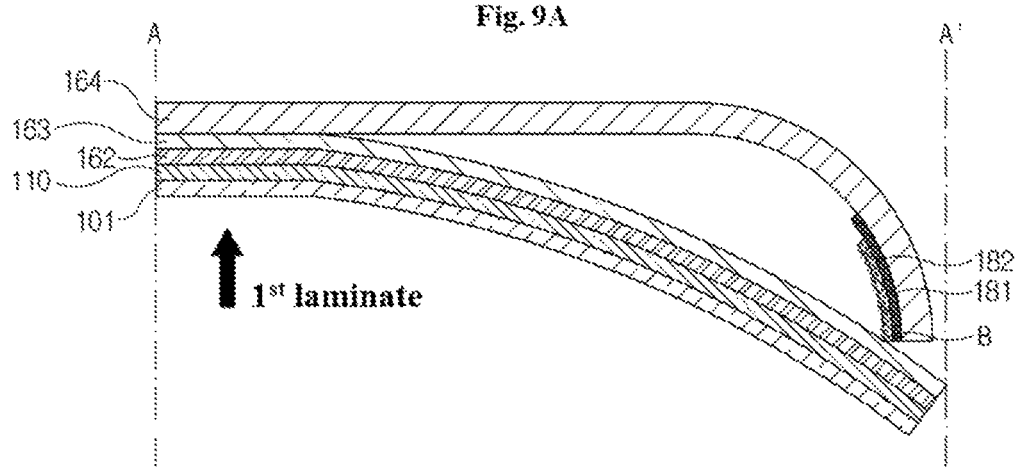
FIGS. 9A and 9B show cross sections taken along A-A' of FIG. 8 according to an embodiment of the present disclosure.
Figure 9B:
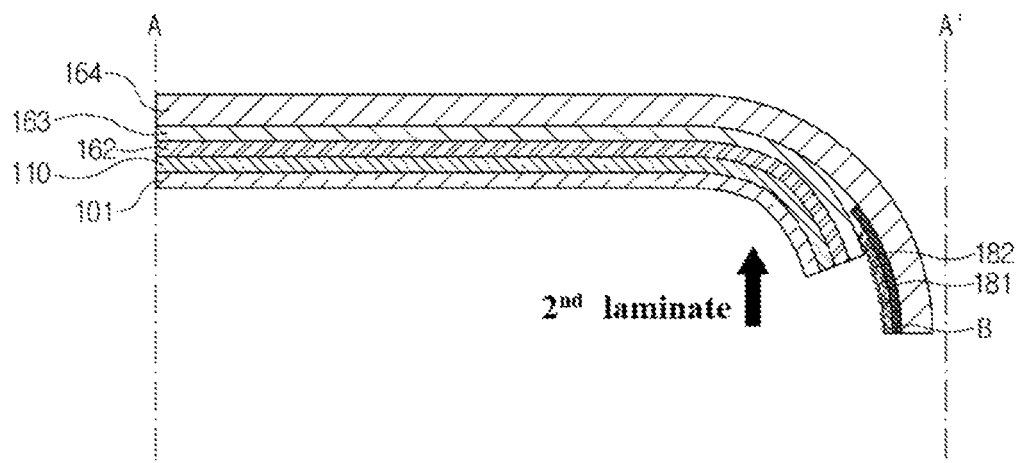

FIGS. 9A and 9B show cross sections taken along A-A' of FIG. 8 according to an embodiment of the present disclosure.

FIGS. 9A and 9B illustrate the cover window 164, the adhesive layer 163 disposed below the cover window 164, a first ink layer 181 disposed below the cover window 164, a second ink layer 182 disposed below the first ink layer 181 and has the coarse pattern and the panel layer 110 disposed below the adhesive layer 163. Between the panel layer 110 and the adhesive layer 163, a polarizer 162 may be additionally disposed. In addition, the backplate 101 may be additionally disposed below the panel layer 110.

The cover window 164 is disposed on an uppermost surface of the display panel 100 and may be formed of glass or plastic. The cover window 164 serves as a protection layer protecting internal elements of the display panel 100 and are exposed outside.

The adhesive layer 163 is disposed below the cover window 164 and serves to adhere the cover window 164 to components disposed below, for example, the polarizer 162, the panel layer 110, the backplate 101 and the like. The adhesive layer 163 may be, for example, optical clear adhesive (OCA) or pressure sensitive adhesive (PSA) which are transparent materials.

The polarizer 162 may be formed of a film having a feature of polarization. The polarizer 162 may suppress reflection of external light and reduce luminous reflectance. The polarizer 162 may be disposed in the active area (AA).

The backplate 101 is a firm structure formed below the panel layer 110 and may serve to reinforce rigidity of the panel layer 110. The backplate 101 may be formed of a thin plastic film.

According to the present disclosure, the first ink layer 181 may be disposed below the cover window 164. In addition, the second ink layer 182 may be disposed below the first ink layer 181. The first ink layer 181 and the second ink layer 182 may be a black ink material. Therefore, if the first ink layer 181 and the second ink layer 182 are formed along outer edges of the cover window 164, a black bezel may be formed along the outer edges of the cover window 164. The black bezel formed in such a method may increase luminous efficiency of the display panel. Also, the ink layers may be formed in a different color other than black depending on a design.

The second ink layer 182 may include a coarse pattern. Specifically, the second ink layer 182 may include an embossed pattern. In order to implement the embossed pattern, the second ink layer 182 may include a plurality of beads (B). The second ink layer 182 may be formed in a pad printing method, and a second ink material that forms the second ink layer 182 may include a plurality of beads (B). The second ink material is transferred onto a printing pad, and the printing pad may be compressed on the cover window 164. Consequently, the second ink layer 182 formed below the cover window 164 may include a plurality of beads. How to form the first ink layer 181 and the second ink layer 182 in a pad printing method will be described with reference to FIG. 15 below.

Referring to FIG. 9A, the adhesive layer 163, the polarizer 162, the panel layer 110 and the backplate 101 may be laminated as a first lamination below the cover window 164 in which the first ink layer 181 and the second ink layer 182 having an embossed coarse pattern are applied. The first lamination refers to laminating layers positioned in an inner direction of the display panel. The inner direction refers to a direction towards the center of the display panel and refers to A-direction that is a cut line based on FIGS. 9A and 9B. To the contrary, an outer direction of the display panel refers to a direction towards a perimeter and refers to A'-direction which is a cut line based on FIGS. 9A and 9B.

As illustrated in in FIG. 9A, after the first lamination, the adhesive layer 163 and configurations disposed below the adhesive layer 163 which are the polarizer 162, the panel layer 110 and the backplate 101 may seem to be hung at an end of the cover window 164. That is because the first lamination compresses the inside of the display panel.

As illustrated in FIG. 9B, after a second lamination, the adhesive layer 163 and configurations disposed below the adhesive layer 163 which are the polarizer 162, the panel layer 110 and the backplate 101 may be settled on the inside of a rear surface of the cover window 164. That is because the second lamination compresses the outer part of the display panel where a curve is formed in the display panel.

According to the present embodiment, the first ink layer 181 and the second ink layer 182 may be applied at an end of a rear surface of the cover window 164. In addition, since the second ink layer 182 includes a plurality of beads (B), a surface of the second ink layer 182 may have an embossed coarse pattern.

According to the present embodiment, since the second ink layer 182 has the coarse pattern, problems that are the leftover of the adhesive layer 163 in the second ink layer 182 and the swept mark in the adhesive layer 163 during the second lamination process may improve.

Apart from the present embodiment, assume that the second ink layer 182 does not have the coarse pattern. The rear surface of the second ink layer 182 may be smooth. The adhesive layer 163 is an OCA or PSA material, and may have viscosity before hardened. During the second lamination after the first lamination, when the adhesive layer 163 having viscosity is moved towards the inside of the cover window 164, since the surface of the second ink layer 182 being rubbed by the adhesive layer 163 is smooth, a degree of such rubbing is big. Therefore, some of the adhesive layer 163 is left on the surface of the second ink layer 182 as a leftover.

According to the present embodiment, the coarse pattern of the second ink layer 182 serves to reduce an area contacting with the adhesive layer 163. That is, the surface of the second ink layer 182 has curves due to the embossed pattern or beads (B), the area contacting with the adhesive layer 163 becomes relatively small. Therefore, even though the adhesive layer 163 having viscosity during the second lamination after finishing the first lamination is moved toward the inside of the cover window 164, the degree of rubbing between the adhesive layer 163 and the second ink layer 182 is relatively small. Therefore, the leftover of the adhesive layer 163 does not exist in the surface of the second ink layer 182.

Figure 10:
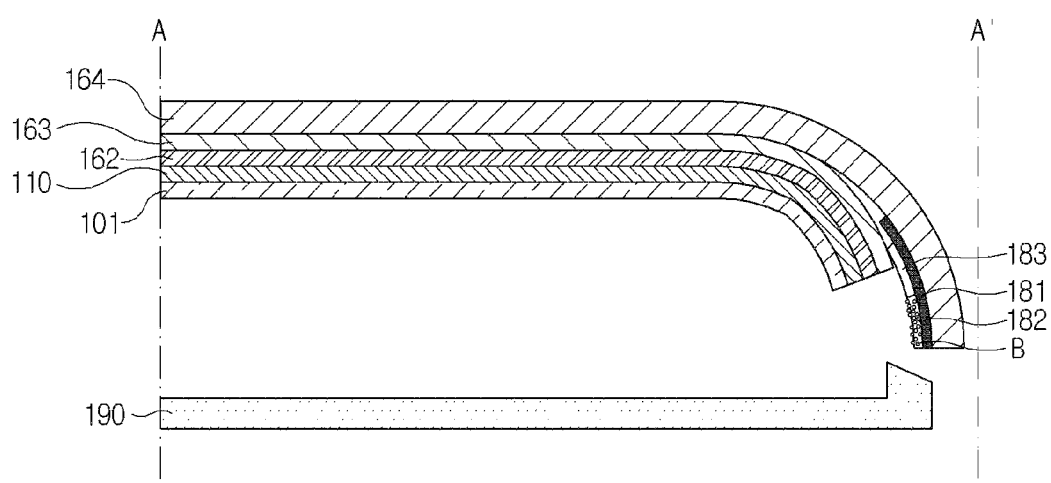
FIG. 10 is a modified embodiment of the embodiment of FIG. 9 and shows a cross section taken along A-A' of FIG. 8 according to an embodiment of the present disclosure.

FIG. 10 is a modified embodiment of the embodiment of FIG. 9 and shows a cross section taken along A-A' of FIG.

8 according to one embodiment. In describing the embodiment of FIG. 10, matters that are redundant will be omitted.

FIG. 10 illustrates the cover window 164, the adhesive layer 163 disposed below the cover window 164, the first ink layer 181 disposed below the cover window 164, the second ink layer 182 disposed below the first ink layer 181 and has the coarse pattern and the panel layer 110 disposed below the adhesive layer 163. Between the panel layer 110 and the adhesive layer 163, the polarizer 162 may be additionally disposed. Also, the backplate 101 may be additionally disposed below the panel layer 110.

According to the present embodiment, a third ink layer 183 may be disposed below the first ink layer 181. Specifically, the third ink layer 183 may be formed on the same layer as the second ink layer 182. Also, the third ink layer 183 may be disposed on more inner side than the second ink layer 182. In addition, the third ink layer 183 may not include the coarse pattern.

The middle frame 190 is a configuration forming an exterior of a bottom portion of the display panel and may be coupled to the lower portion of the cover window 164. Specifically, the middle frame 190 may be coupled to an end portion of the cover window 164 and may be coupled by an adhesive material (not illustrated). Therefore, the middle frame 190 may be in contact with the second ink layer 182 and the third ink layer 183.

Apart from the present embodiment, assume that the third ink layer 183 is not formed below the cover window 164. The embossed coarse pattern is formed on the surface of the second ink layer 182. Therefore, the coupling strength between the second ink layer 182 and the middle frame 190 is low. As explained above, that is because an area contacting with the adhesive material (not illustrated) or the middle frame 190 is relatively reduced thanks to the embossed coarse pattern on the surface of the second ink layer 182. Therefore, there may be a problem that the middle frame 190 detaches from the cover window 164.

The present embodiment suggests to dispose the third ink layer 183 below the first ink layer 181, dispose the third ink layer 183 on more inner side than the second ink layer 182 and attach the third ink layer 183 to the middle frame 190. Since the third ink layer 183 does not have the embossed coarse pattern on the surface, attachment strength between the third ink layer 183 and the middle frame 190 may increase. Consequently, the problem of detachment that the middle frame 190 detaches from the cover window 164 may improve.

Figure 11A:
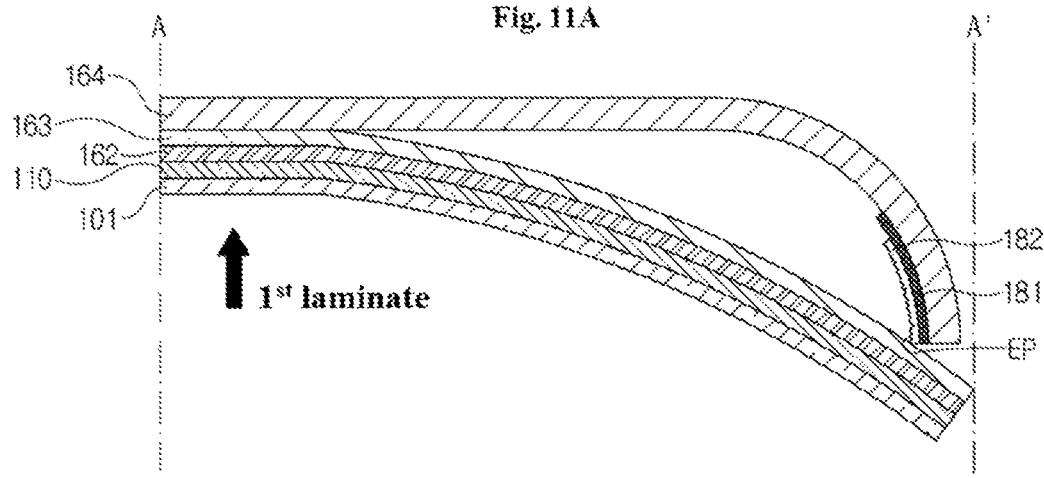
FIGS. 11A to 11B shows cross sections taken along A-A' of FIG. 8 according to another embodiment of the present disclosure.
Figure 11B:
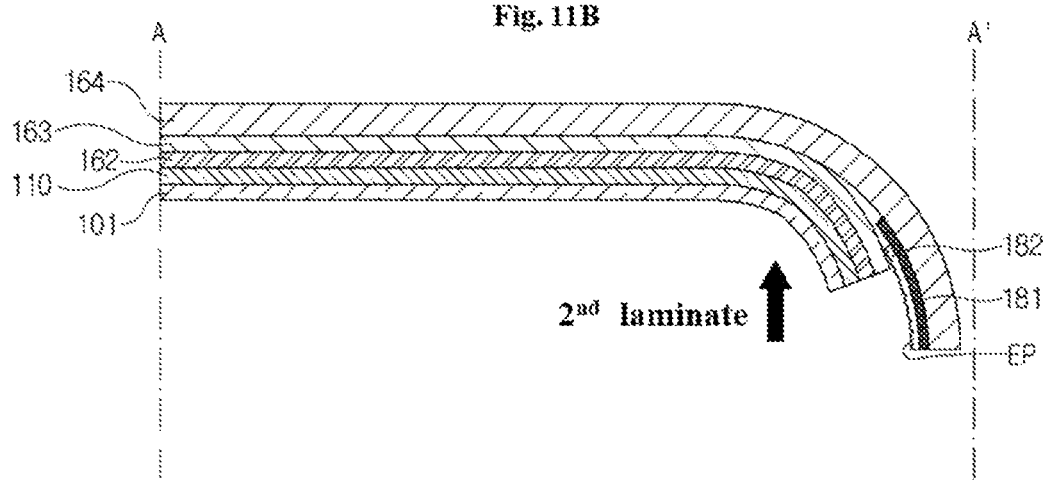

FIGS. 11A and 11B show cross sections taken along A-A' of FIG. 8 according to another embodiment of the present disclosure. In describing the embodiment of FIG. 11, matters that are redundant with what are mentioned above will be omitted.

FIGS. 11A and 11B illustrate the cover window 164, the adhesive layer 163 disposed below the cover window 164, the first ink layer 181 below the cover window 164, the second ink layer 182 disposed below the first ink layer 181 and has the coarse pattern and the panel layer 110 disposed below the adhesive layer 163. The polarizer 162 may be additionally disposed between the panel layer 110 and the adhesive layer 163. In addition, the backplate 101 may be additionally disposed below the panel layer 110.

According to the present disclosure, the first ink layer 181 may be disposed below the cover window 164. In addition, the second ink layer 182 may be disposed below the first ink layer 181.

The second ink layer 182 may have the coarse pattern. Specifically, the second ink layer 182 may have an engraving pattern. In order to implement the engraving pattern, the second ink layer 182 may include an engraved part (EP) that is formed regularly or irregularly on the surface. The second ink layer 182 may be formed in the pad printing method, and an embossed pattern (for example, embossed part) may be formed in an application area to which apply the second ink material in the printing pad to which second ink material is transferred. When the second ink material is transferred onto the printing pad and the printing pad is compressed on the cover window 164, the engraving pattern such as the engraved part (EP) may be formed in the second ink layer 182 that is formed below the cover window 164. A method to form the first ink layer 181 and the second ink layer 182 in the pad printing method will be described hereinbelow with reference to FIG. 16.

Referring to FIG. 11A, below the cover window 164 where the first ink layer 181 and the second ink layer 182 including the engraved coarse pattern are applied, the adhesive layer 163, the polarizer 162, the panel layer 110 and the backplate 101 may be laminated as a first lamination. The first lamination refers to laminating layers in an inner direction of the display panel. The inner direction refers to a direction towards a center of the display panel and refers to A-direction that is a cut line based on FIGS. 11A and 11B. To the contrary, an outer direction of the display panel refers to a direction towards a perimeter and refers to A'-direction which is a cut line based on FIGS. 11A and 11B.

As illustrated in FIG. 11A, after the first lamination, the adhesive layer 163 and configurations disposed below the adhesive layer 163 which are the polarizer 162, the panel layer 110 and the backplate 101 may seem to be hung at an end of the cover window 164. That is because the first lamination compresses the inside of the display panel.

As illustrated in FIG. 11B, after a second lamination, the adhesive layer 163 and configurations disposed below the adhesive layer 163 which are the polarizer 162, the panel layer 110 and the backplate 101 may be settled on the inside of a rear surface of the cover window 164. That is because the second lamination compresses the outer part of the display panel where a curve is formed.

According to the present embodiment, the first ink layer 181 and the second ink layer 182 may be applied at an end of the rear surface of the cover window 164. In addition, since the second ink layer 182 includes an engraved part (EP) to form an engraving pattern, a surface of the second ink layer 182 may have an engraved coarse pattern.

According to the present embodiment, since the second ink layer 182 has the coarse pattern, problems that are the leftover of the adhesive layer 163 remaining in the second ink layer 182 and the swept mark that may occur in the adhesive layer 163 during the second lamination process may improve.

Apart from the present embodiment, assume that the second ink layer 182 does not have the coarse pattern. The rear surface of the second ink layer 182 may be smooth. The adhesive layer 163 is an OCA or PSA material, and may have viscosity before hardened. During the second lamination after the first lamination, when the adhesive layer 163 having viscosity is moved towards the inside of the cover window 164, since the surface of the second ink layer 182 being rubbed by the adhesive layer 163 is smooth, a degree of such rubbing is big. Therefore, some of the adhesive layer 163 is left on the surface of the second ink layer 182 as a leftover.

According to the present embodiment, the coarse pattern of the second ink layer 182 serves to reduce an area contacting with the adhesive layer 163. That is, the surface of the second ink layer 182 has curves due to the embossed pattern or the engraved part (EP), the area contacting with the adhesive layer 163 becomes relatively small. Therefore, even though the adhesive layer 163 having viscosity during the second lamination after finishing the first lamination is moved toward the inside of the cover window 164, the degree of rubbing between the adhesive layer 163 and the second ink layer 182 is relatively small. Therefore, the leftover of the adhesive layer 163 does not exist in the surface of the second ink layer 182.

Figure 12:
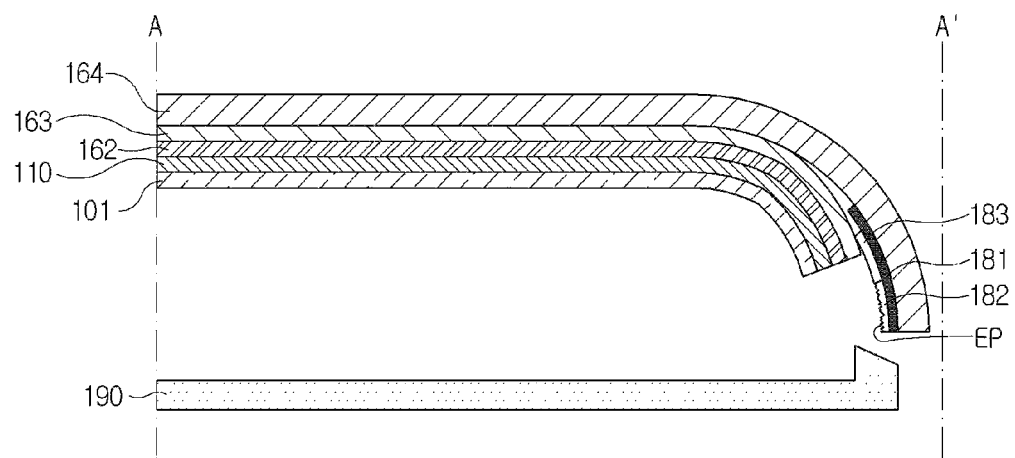
FIG. 12 is a modified embodiment of the embodiment of FIG. 11 and shows a cross section taken along A-A' of FIG. 8 according to an embodiment of the present disclosure.

FIG. 12 is a modified embodiment of the embodiment of FIG. 11 and shows a cross section taken along A-A' of FIG. 8. In describing the embodiment of FIG. 12, matters that are redundant will be omitted.

FIG. 12 illustrates the cover window 164, the adhesive layer 163 disposed below the cover window 164, the first ink layer 181 disposed below the cover window 164, the second ink layer 182 disposed below the first ink layer 181 and has the coarse pattern and the panel layer 110 disposed below the adhesive layer 163. Between the panel layer 110 and the adhesive layer 163, the polarizer 162 may be additionally disposed. Also, the backplate 101 may be additionally disposed below the panel layer 110.

According to the present embodiment, a third ink layer 183 may be disposed below the first ink layer 181. Specifically, the third ink layer 183 may be formed on the same layer as the second ink layer 182. Also, the third ink layer 183 may be disposed on more inner side than the second ink layer 182. In addition, the third ink layer 183 may not include the coarse pattern.

The middle frame 190 is a configuration forming an exterior of a bottom portion of the display panel and may be attached to the lower portion of the cover window 164. Specifically, the middle frame 190 may be coupled with an end portion of the cover window 164 and may be coupled by an adhesive material (not illustrated). Therefore, the middle frame 190 may be in contact with the second ink layer 182 and the third ink layer 183.

Apart from the present embodiment, assume that the third ink layer 183 is not formed below the cover window 164. The engraved coarse pattern is formed on the surface of the second ink layer 182. Therefore, the coupling strength between the second ink layer 182 and the middle frame 190 is low. As explained above, that is because an area contacting with the adhesive material (not illustrated) or the middle frame 190 is relatively reduced thanks to the engraved coarse pattern on the surface of the second ink layer 182. Therefore, there may be a problem that the middle frame 190 detaches from the cover window 164.

The present embodiment suggests to dispose the third ink layer 183 below the first ink layer 181, dispose the third ink layer 183 on more inner side than the second ink layer 182 and attach the third ink layer 183 to the middle frame 190. Since the third ink layer 183 does not have the engraved coarse pattern on the surface, attachment strength between the third ink layer 183 and the middle frame 190 may increase. Consequently, the problem of detachment that the middle frame 190 detaches from the cover window 164 may improve.

FIGS. 13A and 13B show cross sections taken along A-A' of FIG. 8 according to an embodiment of the present disclosure.

According to the present embodiment, the first ink layer 181 may be formed below the cover window 164. Below the first ink layer 181, the second ink layer 182 may be formed. In the second ink layer 182, the embossed coarse pattern including beads (B) may be formed.

An end of the first ink layer 181 protrudes further inwards than an end of the second ink layer 182. In other words, an end of the first ink layer 181 shown in D region in FIG. 13B protrudes further inwards than an end of the second ink layer 182. Consequently, the first ink layer 181 and the second ink layer 182 together may take a form of steps. Between the first ink layer 181, the second ink layer 182 and the adhesive layer 163, a space (H2) may be formed.

In comparison with FIG. 13B, in FIG. 13A, an end of the first ink layer 181 protrudes to an extent the same as an end of the second ink layer 182. That is, an end of the first ink layer 181 shown in C region of FIG. 13A protrudes to an extent the same as an end of the second ink layer 182. Consequently, the first ink layer 181 and the second ink layer 182 together take a form of rising high rather than steps. Between the first ink layer 181, the second ink layer 182 and the adhesive layer 163, a space (H1) may be formed.

The space (H2) according to an embodiment (FIG. 13B) of the present disclosure is smaller than the space (H1) of the compared example (FIG. 13A). If the space (H1) is big, the adhesive layer 163 may be easily detached from the cover window 164. If the space (H2) is small, the adhesive layer 163 may not be easily detached cover window 164.

Therefore, since an end of the first ink layer 181 protrudes further inwards than an end of the second ink layer 182 according to the present embodiment, a problem that the adhesive layer 163 detaches from the cover window 164 may be solved.

Figure 14A:
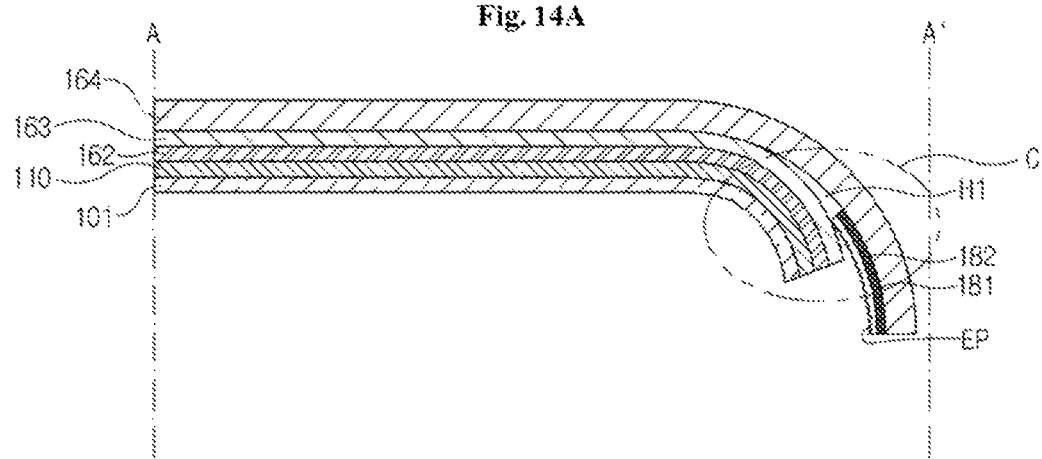
FIGS. 14A and 14B show cross sections taken along A-A' of FIG. 8 according to another embodiment of the present disclosure.
Figure 14B:
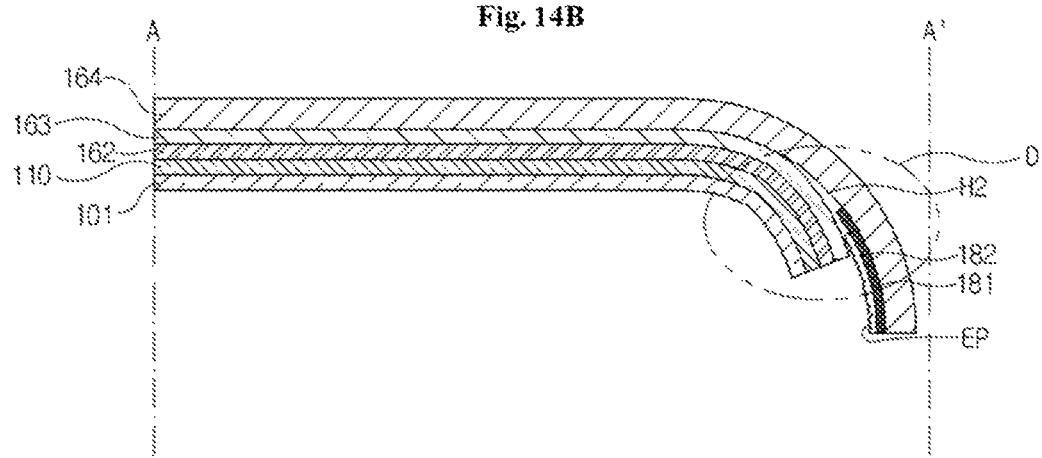

FIGS. 14A and 14B show cross sections taken along A-A' of FIG. 8 according to another embodiment of the present disclosure.

According to the present embodiment, the first ink layer 181 may be formed below the cover window 164. Below the first ink layer 181, the second ink layer 182 may be formed. In the second ink layer 182, the engraving coarse pattern including an engraved part (EP) may be formed.

An end of the first ink layer 181 protrudes further inwards than an end of the second ink layer 182. In other words, an end of the first ink layer 181 shown in D region in FIG. 14B protrudes further inwards than an end of the second ink layer 182. Consequently, the first ink layer 181 and the second ink layer 182 together may take a form of steps. Between the first ink layer 181, the second ink layer 182 and the adhesive layer 163, a space (H2) may be formed.

In comparison with FIG. 14B, in FIG. 14A, an end of the first ink layer 181 protrudes to an extent the same as an end of the second ink layer 182. That is, an end of the first ink layer 181 shown in C region of FIG. 14A protrudes to an extent the same as an end of the second ink layer 182. Consequently, the first ink layer 181 and the second ink layer 182 together take a form of rising high rather than steps. Between the first ink layer 181, the second ink layer 182 and the adhesive layer 163, a space (H1) may be formed.

The space (H2) according to an embodiment (FIG. 14B) of the present disclosure is smaller than the space (H1) of the compared example (FIG. 14A). If the space (H1) is big, the adhesive layer 163 may be easily detached from the cover window 164. If the space (H2) is small, the adhesive layer 163 may not be easily detached cover window 164.

Therefore, since an end of the first ink layer 181 protrudes further inwards than an end of the second ink layer 182 according to the present embodiment, a problem that the adhesive layer 163 detaches from the cover window 164 may improve.

FIGS. 15A to 15F are drawings describing a manufacturing method of a display panel according to an embodiment of the present disclosure.

Referring to FIGS. 15A to 15F, a method of pad printing may be used to form the first ink layer 181 and the second ink layer 182 in the cover window 164. Other methods comparable to the pad printing method may be a spray printing, lamination after film printing and the like. A spray printing refers to forming ink layers by spraying ink onto a surface of the cover window 164. Lamination after film printing refers to a method in which ink is screen-printed onto a film made of polyethylene terephthalate (PET) and laminate the film onto which screen-printing is applied with the cover window 164. The pad printing provided by the present disclosure refers to a method in which ink is transferred onto a printing pad and compress the printing pad onto which ink is transferred on the cover window 164.

Figure 15A:
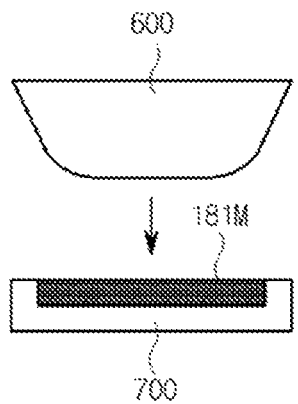
FIGS. 15A to 15F are drawings describing a manufacturing method of a display panel according to an embodiment of the present disclosure.

Referring to FIG. 15A, the printing pad 600 is compressed on a plate 700 in which a first ink material 181M is filled. The plate 700 may have the engraving pattern and the first ink material 181M may be filled in the engraving pattern. When the printing pad 600 is compressed on the plate 700, the first ink material 181M may be transferred onto a certain part of the printing pad 600. Consequently, the first ink layer 181 may be formed on the printing pad 600.

Figure 15B:
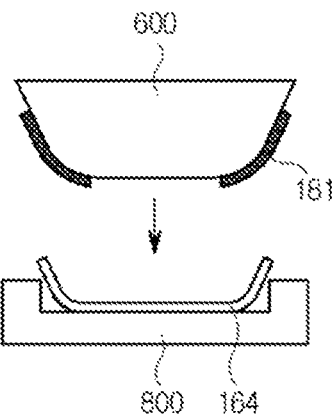

Referring to FIG. 15B, the printing pad 600 may be moved to an upper side of a jig 800 to which the cover window 164 is fixed. The jig 800 is a device to fix a printing object, and may be a component to fix the cover window 164 in the present disclosure. The printing pad 600 on which the first ink layer 181 is formed is compressed on the cover window 164.

Figure 15C:
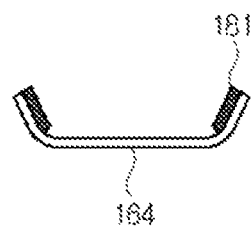

Referring to FIG. 15C, the first ink layer 181 may be formed on the cover window 164.

Figure 15D:
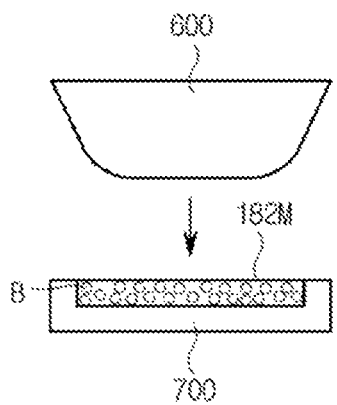

Referring to FIG. 15D, the printing pad 600 is compressed on the plate 700 in which the second ink material 182M is filled. The plate 700 and the printing pad 600 may be different from those in FIGS. 15A to 15C. The second ink material 182M may include a plurality of beads (B). When the printing pad 600 is compressed on the plate 700, the second ink material 182M may be transferred onto certain parts of the printing pad 600. Consequently, the second ink layer 182 may be formed on the printing pad 600. In addition, the second ink layer 182 formed on the printing pad 600 may include beads (B).

Figure 15E:
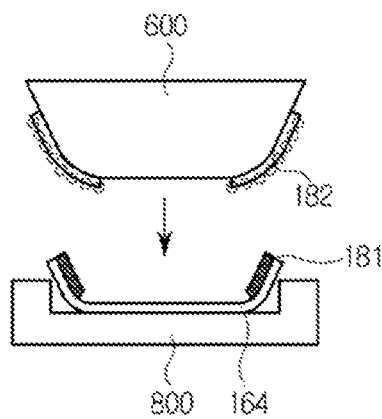

Referring to (FIG. 15E, the printing pad 600 may be moved to an upper side of a jig 800 to which the cover window 164 is fixed. At this time, the first ink layer 181 may be formed on the cover window 164 from the previous step shown in FIG. 15C. The printing pad 600 on which the second ink layer 182 is formed is compressed on the cover window 164.

Figure 15F:
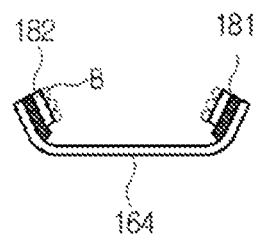

Referring to FIG. 15F, the second ink layer 182 may be formed on the cover window 164 on which the first ink layer 181 is formed.

By doing so, on the cover window 164, the second ink layer 182 with the embossed coarse pattern therein formed on the first ink layer 181 and the first ink layer 181 may be formed.

Thereafter, a step to apply an adhesive layer on the cover window 164 and laminate a panel layer on the cover window 164 may be further fulfilled. Accordingly, a display panel according to an embodiment of the present disclosure may be manufactured.

Further, in the same way as the previously described process, before laminating the panel layer after forming the second ink layer 182 on the cover window 164, by transferring a third ink material onto the printing pad and compressing the printing pad on which the third ink layer is formed on the cover window 164, the third ink layer may be formed. Also, after laminating the panel layer, a step to attach the middle frame to the third ink layer may be fulfilled.

FIGS. 16A to 16F are drawings describing a manufacturing method of a display panel according to another embodiment of the present disclosure. In describing FIGS. 16A to 16F, matters that are redundant with what are mentioned above will be omitted.

Referring to FIGS. 16A to 16F, the pad printing method may be used to form the first ink layer 181 and the second ink layer 182 on the cover window 164.

Figure 16A:
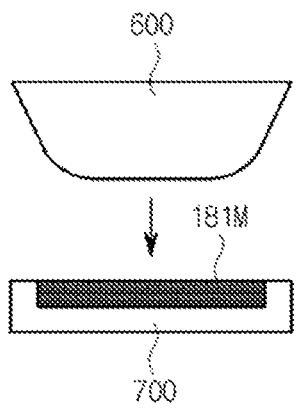
FIGS. 16A to 16F are drawings describing a manufacturing method of a display panel according to another embodiment of the present disclosure.

Referring to FIG. 16A, the printing pad 600 is compressed on the plate 700 in which the first ink material 181M is filled. The plate 700 may have the engraving pattern and the first ink material 181M may be filled in the engraving pattern. When the printing pad 600 is compressed on the plate 700, the first ink material 181M may be transferred onto a certain part of the printing pad 600. Consequently, the first ink layer 181 may be formed on the printing pad 600.

Figure 16B:
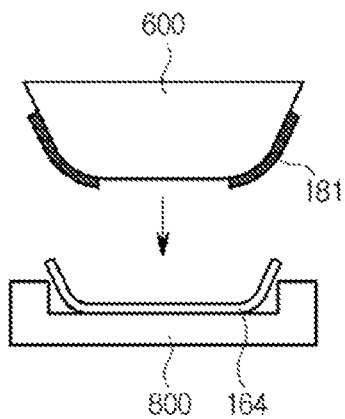

Referring to FIG. 16B, the printing pad 600 may be moved to an upper side of the jig 800 to which the cover window 164 is fixed. The jig 800 is a device to fix a printing object, and may be a component to fix the cover window 164 in the present disclosure. The printing pad 600 on which the first ink layer 181 is formed is compressed on the cover window 164.

Figure 16C:
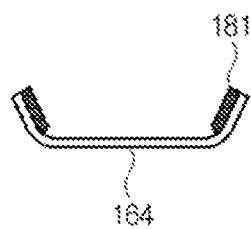

Referring to FIG. 16C, the first ink layer 181 may be formed on the cover window 164.

Figure 16D:
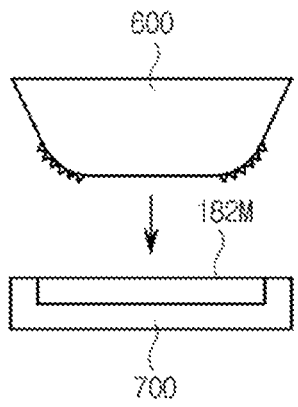

Referring to FIG. 16D, the printing pad 600 is compressed on the plate 700 in which a second ink material 182M is filled. The plate 700 and the printing pad 600 may differ from what are used in the previous steps in FIGS. 16A and 16C. At this time, an embossed pattern may be formed on the printing pad 600. The embossed pattern may be regular or irregular, and may be protruded from the bottom surface of the printing pad 600. When the printing pad 600 is compressed on the plate 700, the second ink material 182M may be transferred onto a certain part of the printing pad 600. Consequently, the second ink layer 182 may be formed on the printing pad 600.

Figure 16E:
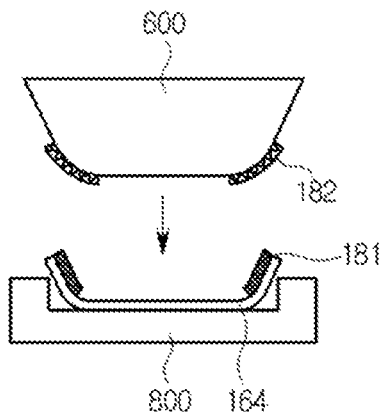

Referring to FIG. 16E, the printing pad 600 may be moved to an upper side of the jig 800 to which the cover window 164 is fixed. At this time, the first ink layer 181 may be formed on the cover window 164 from the previous step (c). The printing pad 600 on which the second ink layer 182 is formed is compressed on the cover window 164.

Figure 16F:
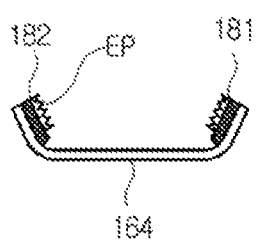

Referring to FIG. 16F, the second ink layer 182 may be formed on the cover window 164 on which the first ink layer 181 is formed. On the surface of the second ink layer 182 being formed, the engraving pattern (EP) may be formed. That is because the embossed pattern has been formed at the bottom portion of the printing pad 600 at steps shown in FIGS. 16D and 16E. In other words, at an upper portion of the second ink layer 182 after removing the printing pad 600 having the embossed pattern, the engraving pattern (EP) contrary to the embossed pattern may be formed.

By doing so, on the cover window 164, the second ink layer 182 with the engraved coarse pattern therein formed on the first ink layer 181 and the first ink layer 181 may be formed.

Thereafter, a step to apply an adhesive layer on the cover window 164 and laminate a panel layer on the cover window 164 may be further fulfilled. Accordingly, a display panel according to an embodiment of the present disclosure may be manufactured.

Further, in the same way as the previously described process, before laminating the panel layer after forming the second ink layer 182 on the cover window 164, by transferring a third ink material onto the printing pad and compressing the printing pad on which the third ink layer is formed on the cover window 164, the third ink layer may be formed on the cover window 164. Also, after laminating the panel layer, a step to attach the middle frame to the third ink layer may be fulfilled.

Those skilled in the art may understand that the present disclosure described herein may be implemented in other concrete forms without departing from the technical concept or essential features thereof. Thus, it should be understood that embodiments described hereinabove are examples in all aspects, and do not limit the present disclosure. The scope of the present disclosure will be denoted by the claims that are provided hereinbelow, rather than the detailed description. In addition, it should be construed that all modifications or variations that are derived from the meaning, scope and the concept of equivalence of the claims are covered in the scope of the present disclosure.

REFERENCE NUMERALS

100: display panel
110: panel layer
101: backplate
164: cover window
163: adhesive layer
162: polarizer
173: heat dissipation sheet
181: first ink layer
182: second ink layer
183: third ink layer
B: beads
EP: engraved part

What is claimed is:

1. A display panel comprising:
   a cover window;
   an adhesive layer below the cover window;
   a first ink layer below the cover window;
   a second ink layer below the first ink layer, the second ink layer including a coarse pattern; and
   a panel layer below the adhesive layer,
   wherein one surface of the first ink layer is in direct contact with the cover window, and another surface opposite to the one surface of the first ink layer is in direct contact with the second ink layer.

2. The display panel of claim 1, wherein the coarse pattern includes an embossed pattern.

3. The display panel of claim 2, wherein the embossed pattern includes a plurality of beads.

4. The display panel of claim 3, wherein the second ink layer is formed in a pad printing method, and wherein a second ink material applied to a printing pad includes the plurality of beads.

5. The display panel of claim 1, wherein the coarse pattern includes an engraving pattern.

6. The display panel of claim 5, wherein the second ink layer is formed in a pad printing method, and an application area of a second ink material has an embossed pattern.

7. The display panel of claim 1, wherein an end of the first ink layer protrudes further towards a center of the display panel than an end of the second ink layer.

8. The display panel of claim 1, further comprising:
   a third ink layer below the first ink layer.

9. The display panel of claim 8, wherein the third ink layer is more towards a center of the display panel than the second ink layer and the third ink layer is attached to a middle frame.

10. The display panel of claim 8, wherein the third ink layer is on a same layer as the second ink layer.

11. The display panel of claim 8, wherein the third ink layer lacks the coarse pattern.

12. The display panel of claim 1, wherein the first ink layer and the second ink layer are along outer edges of the cover window.

13. The display panel of claim 1, further comprising:
   a third ink layer below the first ink layer,
   wherein the third ink layer covers a side surface of the second ink layer.

14. The display panel of claim 1, further comprising:
   a third ink layer below the first ink layer,
   wherein the first ink layer is in direct contact with the second ink layer and the third ink layer.

15. The display panel of claim 1, wherein the cover window includes a flat area and a bending area,
   wherein the first ink layer and the second ink layer are disposed in the bending area.

16. The display panel of claim 15, wherein the panel layer is bent along the bending area.

* * * * *